US011775700B2

(12) United States Patent
Esteban et al.

(10) Patent No.: US 11,775,700 B2
(45) Date of Patent: Oct. 3, 2023

(54) COMPUTER VISION SYSTEMS AND METHODS FOR IDENTIFYING ANOMALIES IN BUILDING MODELS

(71) Applicant: Insurance Services Office, Inc., Jersey City, NJ (US)

(72) Inventors: Jose Luis Esteban, Madrid (ES); Eladio Rego, Cádiz (ES)

(73) Assignee: Insurance Services Office, Inc., Jersey City, NJ (US)

( * ) Notice: Subject to any disclaimer, the term of this patent is extended or adjusted under 35 U.S.C. 154(b) by 510 days.

(21) Appl. No.: 16/593,708

(22) Filed: Oct. 4, 2019

(65) Prior Publication Data

US 2020/0110972 A1 Apr. 9, 2020

Related U.S. Application Data

(60) Provisional application No. 62/741,146, filed on Oct. 4, 2018.

(51) Int. Cl.
*G06F 30/13* (2020.01)
*G01V 1/30* (2006.01)
*G06F 18/2415* (2023.01)
*G06N 7/01* (2023.01)

(52) U.S. Cl.
CPC ............. *G06F 30/13* (2020.01); *G01V 1/302* (2013.01); *G06F 18/2415* (2023.01); *G06N 7/01* (2023.01)

(58) Field of Classification Search
CPC ........ G06K 9/6277; G06K 9/00; G06F 30/00; G06F 30/13; G06F 30/27; G06F 18/2415; G01V 1/302; G06N 7/005; G06N 20/00; G06N 7/01; G06V 10/50; G06T 7/0002

USPC ............................................................. 703/1
See application file for complete search history.

(56) References Cited

U.S. PATENT DOCUMENTS

| 2014/0142905 | A1* | 5/2014 | Drees ............... G06Q 10/06393 703/2 |
| 2017/0116707 | A1 | 4/2017 | Upendran et al. |
| 2018/0082414 | A1 | 3/2018 | Rozenberg et al. |

FOREIGN PATENT DOCUMENTS

| CA | 2489364 C | * 6/2010 | ............. G01C 15/00 |
| CN | 106802879 A | 6/2017 | |
| CN | 107403050 A | 11/2017 | |

(Continued)

OTHER PUBLICATIONS

Cui, Wenqiang et al., "Anomaly Detection and Visualization of School Electricity Consumption Data, 2017, IEEE 2nd International Conference on Big Data Analysis", IEEE. (Year: 2017).*

(Continued)

*Primary Examiner* — Cedric Johnson
(74) *Attorney, Agent, or Firm* — McCarter & English, LLP (57) ABSTRACT

Computer vision systems and methods for detecting anomalous building models are provided. The systems and methods can detect anomalies in building models using one or more of an independent univariate Gaussian algorithm, a multivariate Gaussian algorithm, a combination of a multivariate Gaussian algorithm for continuous features and a frequency histogram algorithm for discrete features, and/or a bin frequency model. The system automatically processes computerized models to determine anomalies, and indicates whether the models are accurate and whether correction is required.

12 Claims, 6 Drawing Sheets

(56) References Cited

FOREIGN PATENT DOCUMENTS

EP 2941640 A1 11/2015
WO 2013/116793 A2 8/2013

OTHER PUBLICATIONS

Freedman, et al., "On the Histogram as a Density Estimator: L2 Theory," Springer-Verlag (1981) 57, pp. 453-476 (24 pages).
Sasaki, "The Truth of the F-Measure," Research Fellow School of Computer Science, University of Manchester (2007) (5 pages).
International Search Report of the International Searching Authority dated Dec. 19, 2019, issued in connection with International Application No. PCT/US2019/054829 (3 pages).
Written Opinion of the International Searching Authority dated Dec. 19, 2019, issued in connection with International Application No. PCT/US2019/054829 (4 pages).
Ehret, et al., "Image Anomalies a Review and Synthesis of Detection Methods," Journal of Mathematical Imaging and Vision (2019) (34 pages).
Extended European Search Report dated May 20, 2022, issued by the European Patent Office in connecton with European Application No. 19868335.1 (15 pages).

\* cited by examiner

| Source Information | Modeling | Wireframe | Sketch Elements |
|---|---|---|---|
| # Images<br>Image Source<br>Image Resolution (GSD)<br>Latitude<br>Longitude<br>Address was Resolved?<br>Modeling Date<br>Parcel Area<br>City | Modeling Application Version<br># Blocks<br># Loops<br>Modeling Time<br>Avg. Coplanarity Error<br>Max. Coplanarity Error<br>Operator<br>QC Operator<br>Has QC Warnings | % Perimeter<br>% Ridge<br>% Hip<br>% Valley<br>% Flashing<br># Repeated Values<br>Total Length<br>Total Area | Mode Overhang<br># Different Overhang Values<br>Mode Slope<br># Different Slope Values<br># Faces<br># Segments<br># Segments < 1 ft<br># Floors |
| Roof Elements | Wall Structure | Wall Elements | Exterior Elements |
| # Skylights<br># Roof Vents<br># Satellite Dishes<br># Chimneys<br># A/C Units<br>Rain Gutter Length<br>Parapet Length<br>Roof Materials<br># Terraces | Wall Material<br># Intrusions<br>Intrusion Types<br># Extrusions<br>Extrusion Types<br># Nodes at Different Height<br>Ground point was edited<br>Has Basement | Main Entrance Size<br># Entrances<br># Entrance groups<br># Garage Doors<br># Garage Door Groups<br># Windows<br># Window Groups<br># Attic Vents | # Trees<br>Tree Area<br># Pools<br># Sport Courts<br># Trampolines<br># Ground A/C Units<br># Pergolas<br># Porches |

COMPUTER VISION SYSTEMS AND METHODS FOR IDENTIFYING ANOMALIES IN BUILDING MODELS

RELATED APPLICATIONS

This application claims priority to U.S. Provisional Patent Application Ser. No. 62/741,146 filed on Oct. 4, 2018, the entire disclosure of which is hereby expressly incorporated by reference.

BACKGROUND

Technical Field

The present disclosure relates generally to the field of computer vision systems and methods. More particularly, the present disclosure relates to computer vision systems and methods for identifying anomalous building models.

Related Art

A building model is a computer-generated representation of a real property, composed of several features, such as property area, roof area, number of doors, etc. When a building model is created (whether automatically by a computer, semi-automatically (e.g., the computer performs certain model generation functions automatically, but relies on human input for other modeling function), or manually (e.g., the model is generated by the computer using entirely human input), it may or may not accurately represent reality. Its accuracy depends on many diverse factors such as the modeler's skills, the building complexity, the uniqueness of the building, etc. Because the quality and integrity of the models delivered to a customer is very important, a system that can automatically detect when a model is not correct or when it deviates from a normal building model would be extremely helpful. Determining whether a building model is accurate is especially important in a system with massive amounts of data where it is not feasible for all building models to be reviewed by one or more quality control teams. In such circumstances, it is possible for poor-quality models to be delivered to customers without adequate review and correction in advance of delivery.

Once a building has been modeled, a method to detect possible inaccuracies without an additional comparison to the real building is to estimate how likely its combination of features is. Knowing how different features relate to each other can be done by studying a large sample of valid models. Then the likelihood of a new model can be calculated using anomaly detection techniques. A building appearing uncommon is not necessarily wrongly modeled, but deserves an additional check. Current solutions do not address these issues.

Therefore, what would be desirable are computer vision systems and methods for detecting anomalous building models which address the foregoing needs.

SUMMARY

Computer vision systems and methods for detecting anomalous building models are provided. The systems and methods can detect anomalies in building models using one or more of an independent univariate Gaussian algorithm, a multivariate Gaussian algorithm, a combination of a multivariate Gaussian algorithm for continuous features and a frequency histogram algorithm for discrete features, and/or a bin frequency model. The system automatically processes computerized models to determine anomalies, and indicates whether the models are accurate and whether correction is required.

BRIEF DESCRIPTION OF THE DRAWINGS

The foregoing features of the invention will be apparent from the following Detailed Description, taken in connection with the accompanying drawings, in which.

DETAILED DESCRIPTION

The present disclosure relates to computer vision systems and methods for identifying anomalous building models, as discussed in detail below in connection with FIGS. 1-6.

Figure 1:
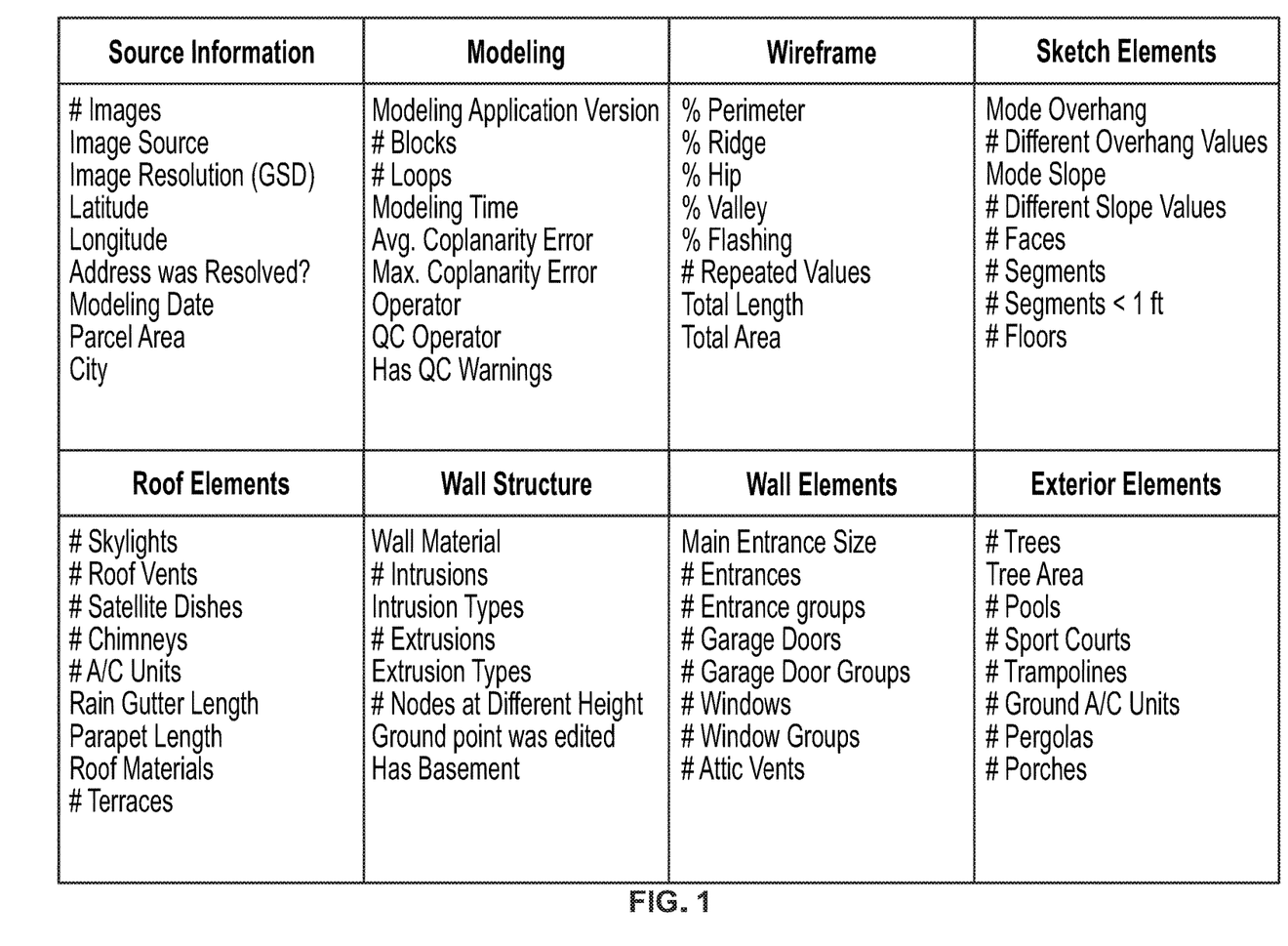
FIG. 1 is a table illustrating a plurality of parameters that can represent a building model.

FIG. 1 is a table illustrating a plurality of parameters that can represent a building model. Buildings of a certain style can share common features. Moreover, buildings of a certain style can also share common patterns among several features. Because of this commonality, poorly modeled buildings can be detected as outliers based on a deviation from the common styles or patterns of those buildings. Unique buildings can also deviate from the common pattern of building features due to their unique combination of features, and therefore can be detected as outliers. The systems and methods of the present disclosure can account for unique buildings as will be discussed herein.

Building features are analyzed in a large sample of buildings to determine which feature combinations can be accepted as normal and which ones should not. The systems and methods disclosed herein can apply anomaly detection to obtain a confidence level for any building model. Anomaly detection can be applied to normal cases that are well-known and where deviations can take many different forms. The systems and methods disclosed herein also improve computer vision capabilities of computer systems by allowing such systems to automatically determine which building models as a whole do not represent anomalous buildings, again improving the accuracy of computer model generation. Moreover, the systems and methods herein improve computer technology by allowing such anomaly detection to occur over a vast amount of data corresponding to detected building features and building models.

Computerized models which can determine whether a building model is anomalous will now be explained in greater detail. These models can automatically calculate a probability for each building model. The lower the probability, the more anomalous the building is. A low probability threshold is defined as (ε) so that models with a probability lower than such a threshold can be considered anomalous. The selection of this value will also be explained in greater detail below.

The present disclosure uses the following notation for a sample set X with m samples of n features. $x_j^{[i]}$ represents the value of the $j^{th}$ feature of the $i^{th}$ element in the sample. $x_j$ represents the vector of m values of the $j^{th}$ feature in all the m samples. $x^{[i]}$ represents the vector of n values of all features of the $i^{th}$ element in the sample. μ represents the vector of the average values of n features. $μ_j$ represents the average value of feature j across all m samples.

Figure 2:
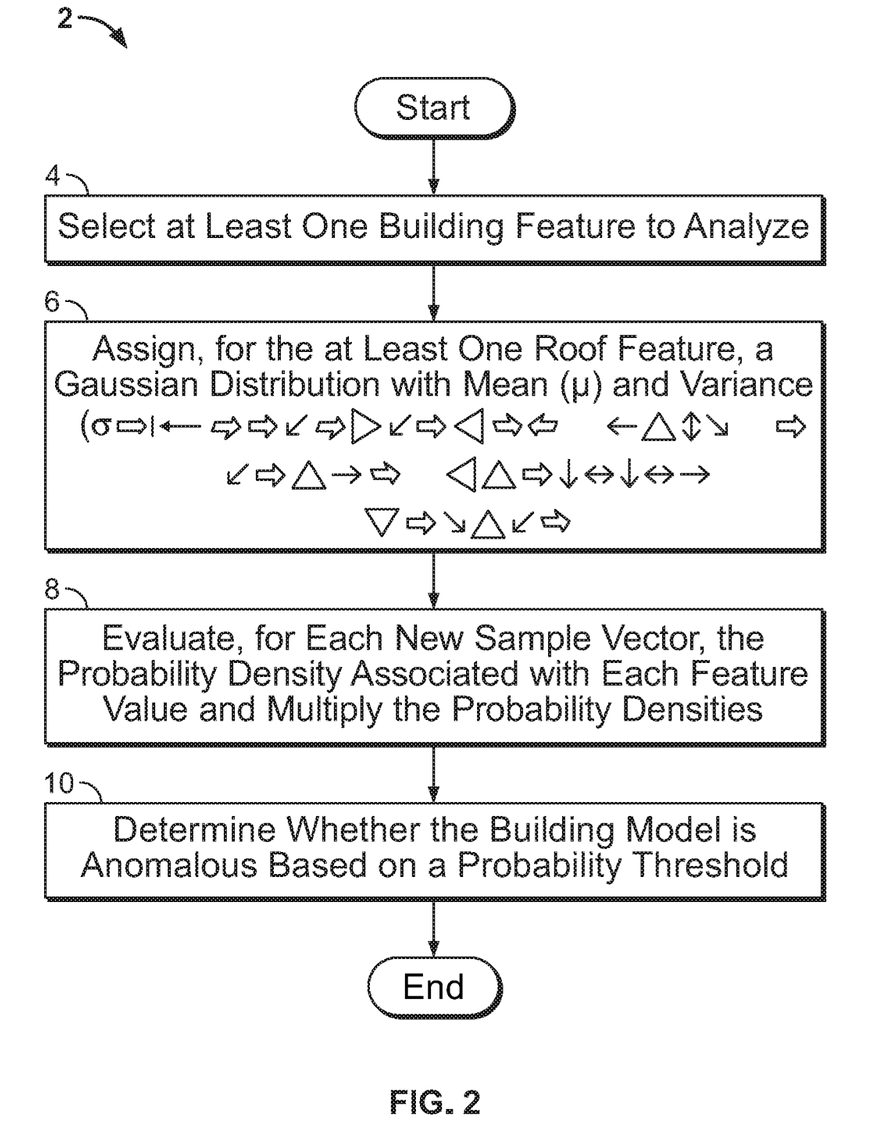
FIG. 2 is a flowchart illustrating processing steps carried out by the system for automatically determining whether a building model is anomalous using a independent univariate Gaussian algorithm.

An independent univariate Gaussian model for determining model accuracy will now be explained in greater detail. FIG. 2 is a flowchart illustrating processing steps 2 carried out by the system for automatically determining whether a building model is accurate using a independent univariate Gaussian algorithm. In step 4, at least one modeled building feature is selected for analysis. Of course, more than one feature should be used in the method. In step 6, each selected building feature is assigned a Gaussian distribution with mean (μ) and variance (σ²) calculated from a large training sample as defined by the below equations:

$$\mu_j = \frac{1}{m}\sum_{i=1}^{m} x_j^{[i]}$$

$$\sigma_j^2 = \frac{1}{m}\sum_{i=1}^{m} \left(x_j^{[i]} - \mu_j\right)^2$$

The features (as listed in FIG. 1) represent high-level building features e.g., the footprint area, the number of windows or the roof slope. Those features may have been obtained automatically or manually by operators. Given a large sample of valid building models (the "training sample"), the mean and standard deviation can be calculated for each one of the features. For example, it is easy to think of the average footprint area and its variance. The formulas above represent the calculation of the average and variance for all the features in the training sample. This is calculated just once as soon as the training sample is available. Once those parameters (average and variance) are known for the training sample, a basic hypothesis is applied assuming each feature follows a gaussian distribution (most values concentrate around the mean and there are fewer cases as you deviate further from it).

In step 8, given a new sample vector $\hat{x}$, the process 2 evaluates the probability density associated with each feature value $$p(\hat{x}_j \mid \mu_j, \sigma_j^2) = \frac{1}{\sqrt{2\pi\sigma_j^2}} e^{\frac{(\hat{x}_j - \mu_j)^2}{2\sigma_j^2}}$$

and then multiplies each of the probabilities densities:

$$p(\hat{x}) = \prod_{j=1}^{n} p(\hat{x}_j \mid \mu_j, \sigma_j^2)$$

In step 10, it is determined whether the building model is anomalous based on a probability threshold. Accordingly, it can be said that a building is anomalous if $p(\hat{x}) < \epsilon$.

Figure 3:
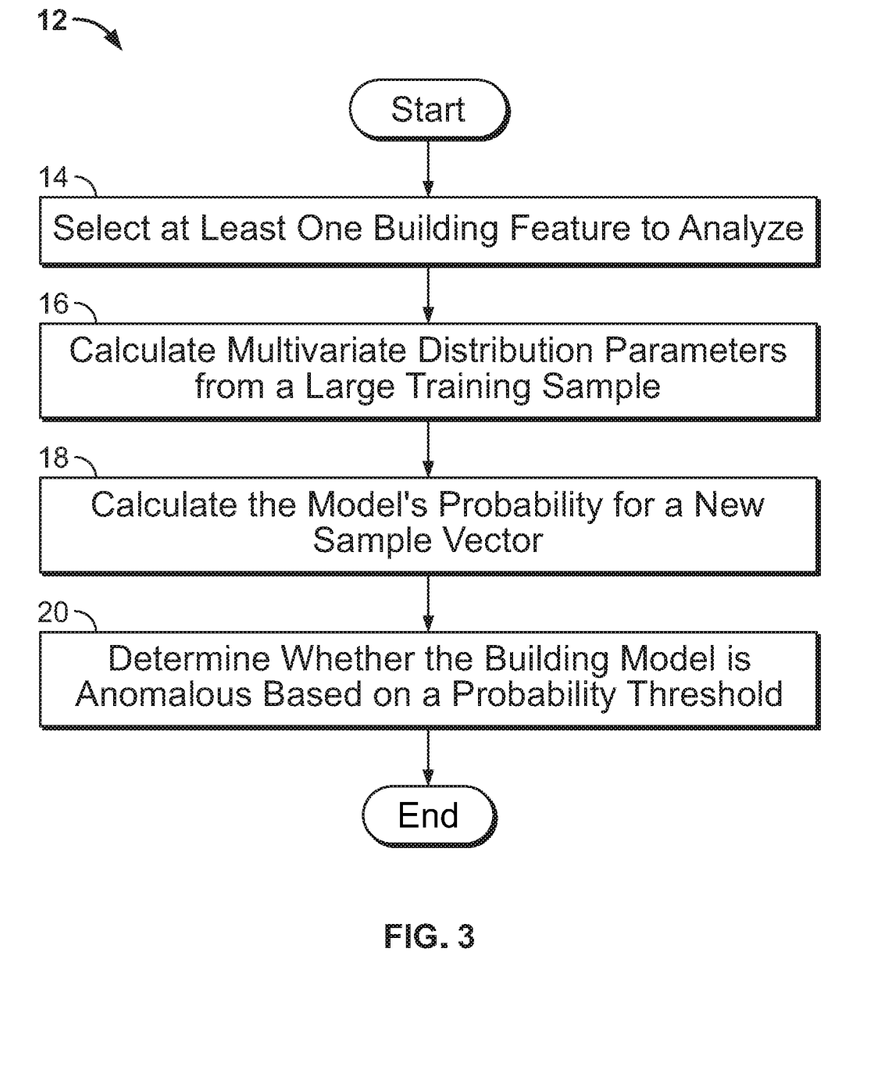
FIG. 3 is a flowchart illustrating processing steps carried out by the system for automatically determining whether a building model is anomalous using a multivariate Gaussian algorithm.

A multivariate Gaussian model for determining model accuracy will now be explained in greater detail. FIG. 3 is a flowchart illustrating processing steps 12 carried out by the system for automatically determining whether a building model is anomalous using a multivariate Gaussian algorithm. In step 14, several building features are selected for analysis. Of course, as many features as needed can be used in the method. In step 16, the process 12 calculates multivariate distribution parameters from a large training sample according to the following equations:

$$\mu = \frac{1}{m}\sum_{i=1}^{m} x^{[i]}$$

$$\Sigma = \frac{1}{m}\sum_{i=1}^{m} (x^i - \mu)(x^i - \mu)^T$$

The features (as listed in FIG. 1) represent high-level building features e.g., the footprint area, the number of windows or the roof slope. Once the training set is available, the vector of average values for each feature can be calculated. This is represented by μ, and is calculated the same as in the previous method of FIG. 2. However, instead of calculating the standard deviation σ² for each variable, the "covariance matrix" Σ is calculated according to the formula above. This represents how each variable is related to each other. The fundamental idea of using a multivariate approach is the fact that highly correlated features should weigh less in the calculation of probabilities. The formula below takes this into account.

In step 18, for a new sample vector the model's probability of accurately representation of the actual building structure is calculated in accordance with the following equation:

$$p(\hat{x}) = \frac{1}{\sqrt{(2\pi)^m |\Sigma|}} e^{-\frac{1}{2}(\hat{x} - \mu)\Sigma^{-1}(\hat{x} - \mu)^T}$$

In step 20, it is determined whether the building model is anomalous based on a probability threshold. Accordingly, it can be said that a building is anomalous if $p(\hat{x}) < \epsilon$.

Figure 4:
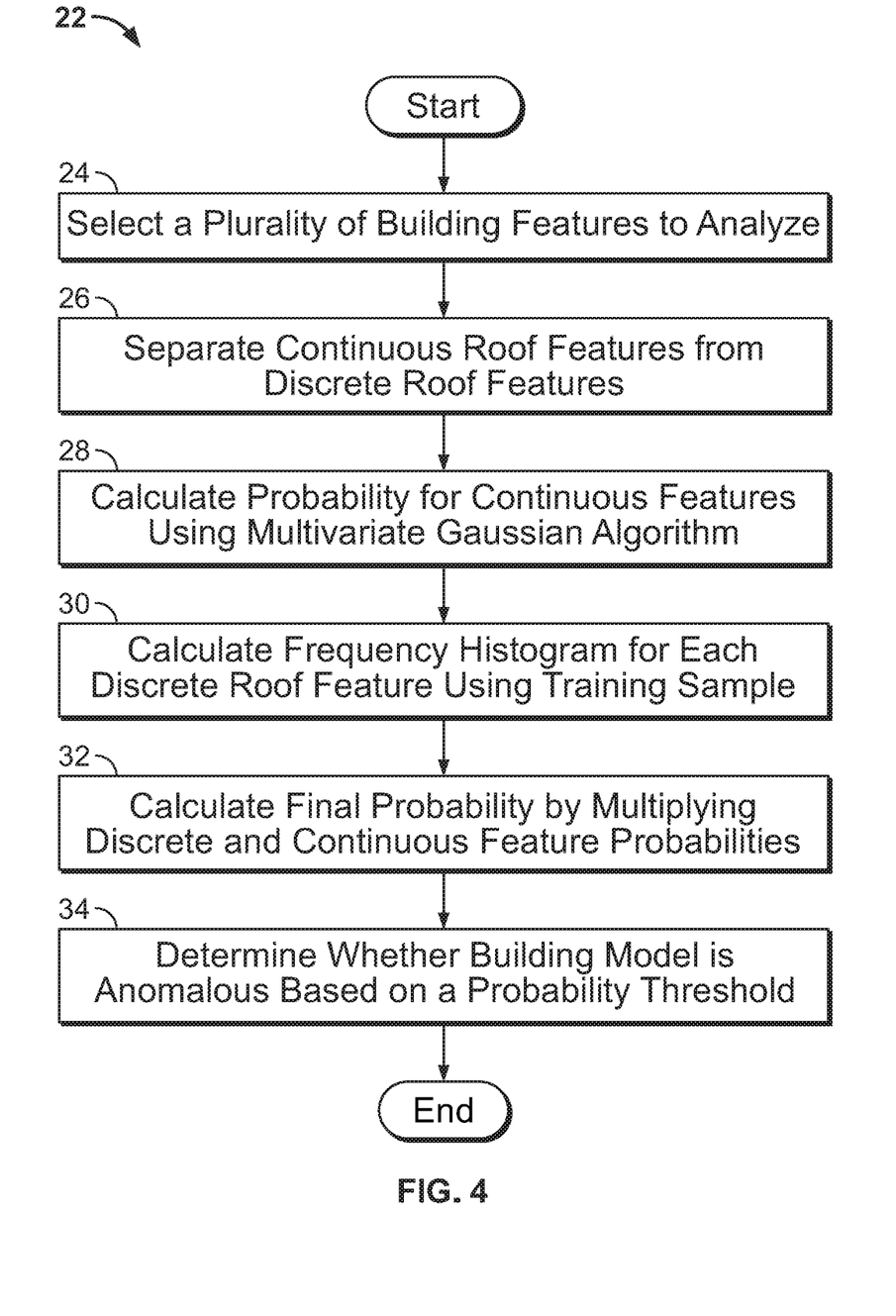
FIG. 4 is a flowchart illustrating processing steps carried out by the system for automatically determining whether a building model is anomalous using a multivariate Gaussian algorithm for continuation features of the building model, and a frequency histogram algorithm for discrete features of the building model.

FIG. 4 is a flowchart illustrating processing steps 22 performed by the system for automatically determining whether a building model is anomalous using a multivariate Gaussian algorithm for continuous building features (area, % of hip edges . . . ) together with a frequency histogram algorithm for discrete building features (number of windows, has basement . . . ). In step 24, a plurality of building features can be selected for analysis. In step 26, the process 22 separates the continuous building features from the discrete building features. In step 28, the probability for each of the continuous features is calculated using the multivariate Gaussian algorithm in accordance with the processing steps described in FIG. 3. In step 30, a frequency histogram is calculated for each discrete feature using the training sample. $n_{jk}$ is the absolute frequency of the $k^{th}$ bin in the histogram of feature j, and $f_{jk}$ is its relative frequency given by the following equation:

$$f_{jk} = \frac{n_{jk}}{m}$$

Given a new model example $\hat{x}$, the probability associated with the discrete features is calculated as the product of the corresponding frequencies: $f_{j\hat{k}}$ as the relative frequency corresponding to the bin $\hat{k}$ corresponding to feature j. This can be represented by the following equation:

$$p(\hat{x}) = \prod_j f_{j\hat{k}}$$

If a discrete feature value appears with a value which has not been seen before, the frequency 1/m can be used. In step 32, the final probability is calculated by multiplying the discrete and continuous probabilities. In step 34, it is determined whether the building model is anomalous based on a probability threshold. Accordingly, it can be said that a building is anomalous if $p(\hat{x}) < \in$.

Figure 5:
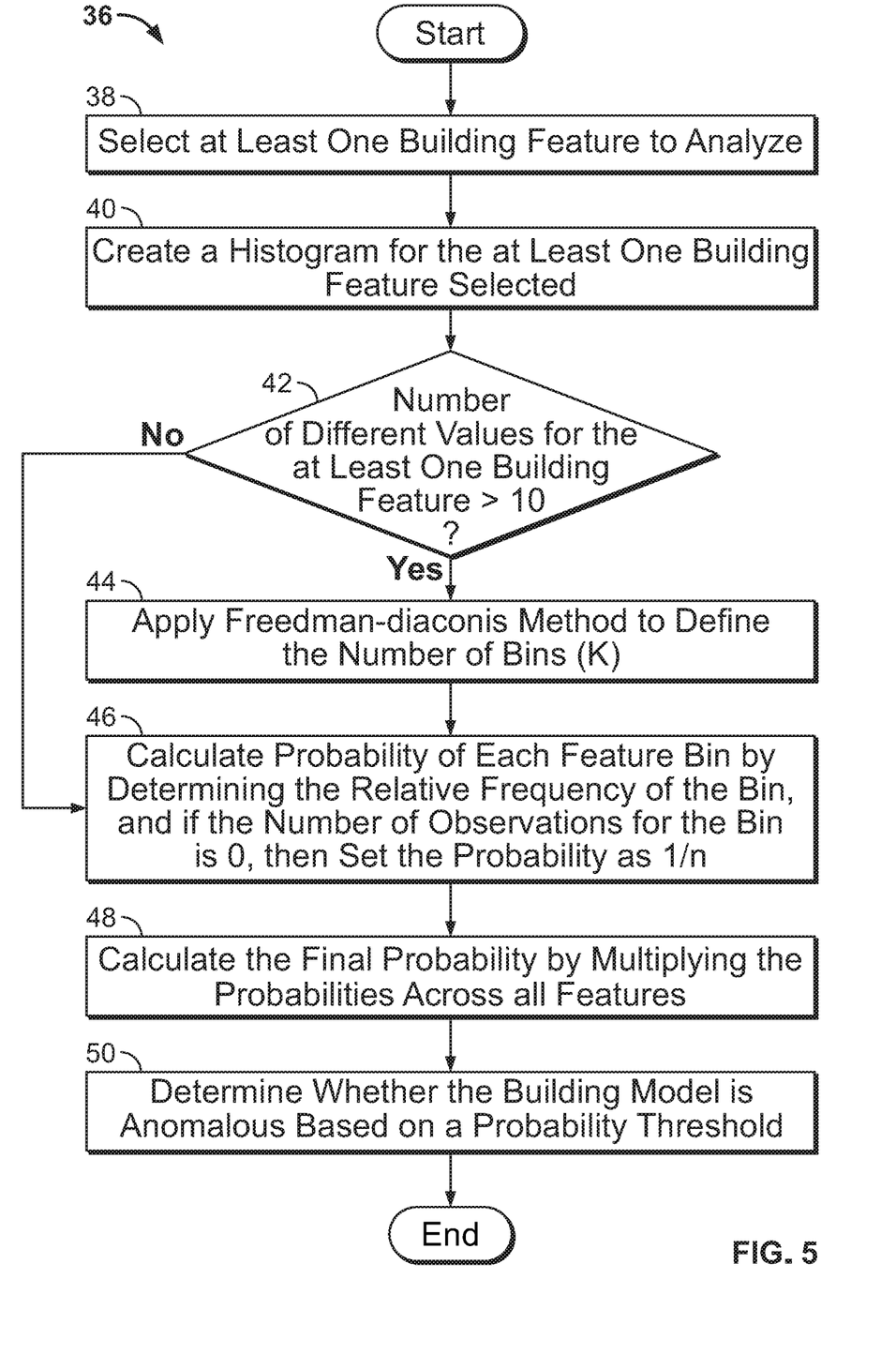
FIG. 5 is a flowchart illustrating processing steps carried out by the system for automatically determining whether a building model is anomalous using a bin frequency model.

A bin frequency model for determining model accuracy will now be explained in greater detail. FIG. 5 is a flowchart illustrating processing steps 36 carried out by the system for automatically determining whether a building model is anomalous using the bin frequency model. In step 38, at least one building feature is selected. Of course, more than one feature can be used in the method. In step 40, a histogram is created for each selected building feature. In step 42, a decision is made as to whether the number of different values for a building feature exceeds 10. If a positive determination is made, the process 36 proceeds to step 44 where the Freedman-Diaconis method is applied to define the number of bins (K) for the building feature. After step 44, the process proceeds to step 46, or if a negative determination is made in step 42, the process directly proceeds to step 46. In step 46, the probability for each feature bin is calculated. In particular, the probability of a feature bin is the relative frequency of the bin. If the number of observations for the bin is 0, then the probability for the bin is 1/m. The process then proceeds to step 48 where the final probability is calculated by multiplying the probabilities across all feature bins. In step 50, it is determined whether the building model is anomalous based on a probability threshold. Accordingly, it can be said that a building is anomalous if $p(\hat{x}) < \in$.

In order to choose the best epsilon value for anomaly detection, a cross validation dataset can be used. The minimum and maximum probabilities found in the dataset are obtained and the interval [log(min), log(max)] can be divided into 10,000 subintervals (although other numbers of the subintervals can be used). Using the probability value in each interval as the ε (epsilon) value yields different classification results (normal or anomalous). The classification results for the dataset are evaluated using the F1-score metric. The value which gives the best F1-score can be used as the ε (epsilon) value to classify anomalies. This provides a non-biased way of setting a meaningful threshold for determining whether a building model can be considered anomalous.

Figure 6:
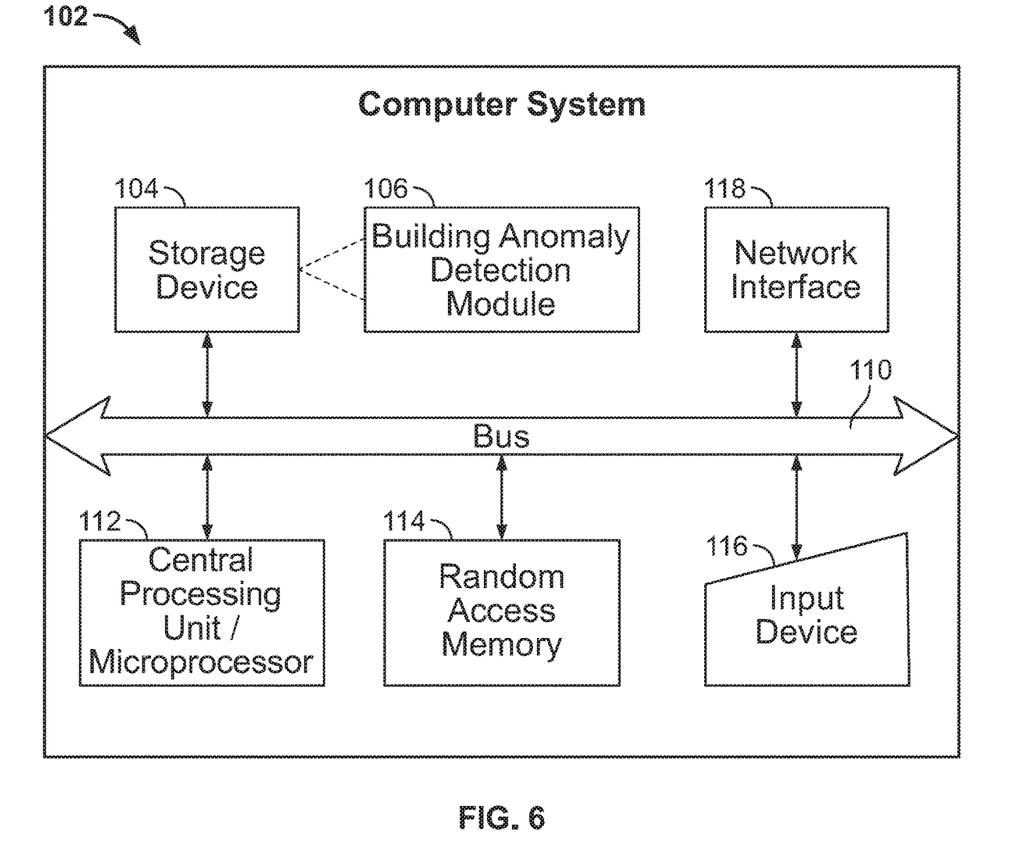
FIG. 6 is a diagram illustrating hardware and software components of a computer system on which the system of the present disclosure could be implemented.

FIG. 6 is a diagram illustrating hardware and software components of a computer system on which the system of the present disclosure could be implemented. The system includes a processing server 102 which could include a storage device 104, a network interface 118, a communications bus 110, a central processing unit (CPU) (microprocessor) 112, a random access memory (RAM) 114, and one or more input devices 116, such as a keyboard, mouse, etc. The server 102 could also include a display (e.g., liquid crystal display (LCD), cathode ray tube (CRT), etc.). The storage device 104 could comprise any suitable, computer-readable storage medium such as disk, non-volatile memory (e.g., read-only memory (ROM), erasable programmable ROM (EPROM), electrically-erasable programmable ROM (EEPROM), flash memory, field-programmable gate array (FPGA), etc.). The server 102 could be a networked computer system, a personal computer, a smart phone, tablet computer etc. It is noted that the server 102 need not be a networked server, and indeed, could be a stand-alone computer system.

The functionality provided by the present disclosure could be provided by a specialized building anomaly detection software module 106, which could be embodied as computer-readable program code stored on the storage device 104 and executed by the CPU 112 using any suitable, high or low level computing language, such as Python, Java, C, C++, C #, .NET, MATLAB, etc. The network interface 108 could include an Ethernet network interface device, a wireless network interface device, or any other suitable device which permits the server 102 to communicate via the network. The CPU 112 could include any suitable single- or multiple-core microprocessor of any suitable architecture that is capable of implementing and running the building anomaly detection program 106 (e.g., Intel processor). The random access memory 114 could include any suitable, high-speed, random access memory typical of most modern computers, such as dynamic RAM (DRAM), etc. The input device 116 could include a microphone for capturing audio/speech signals, for subsequent processing and recognition performed by the engine 106 in accordance with the present disclosure.

Having thus described the system and method in detail, it is to be understood that the foregoing description is not intended to limit the spirit or scope thereof. It will be understood that the embodiments of the present disclosure described herein are merely exemplary and that a person skilled in the art may make any variations and modification without departing from the spirit and scope of the disclosure. All such variations and modifications, including those discussed above, are intended to be included within the scope of the disclosure.

What is claimed is:

1. A method for identifying an anomaly in a computerized building model, comprising the steps of:
   receiving at a computer system the computerized building model, said computerized model representing a building;
   selecting at least one feature of the building for analysis;
   processing the at least one feature to assign a Gaussian distribution having at least one parameter to the selected at least one building feature;
   processing the at least one parameter to determine a probability density of a feature value using a sample vector of the computerized building model;
   processing the computerized building model to improve accuracy of the computerized building model using the probability density;
   further comprising calculating a mean μ and a variance $\sigma^2$ from a training sample using:

$$\mu_j = \frac{1}{m}\sum_{i=1}^{m} x_j^{[i]} \quad \sigma_j^2 = \frac{1}{m}\sum_{i=1}^{m}(x_j^{[i]} - \mu_j)^2$$

where m=a number of samples; and determining the computerized building model is anomalous when a multiplied probability density p(x̂) of each of the probability density of a mean μ feature value and the probability density of the probability density of a variance σ² feature value is less than a probability threshold.

2. The method of claim 1, further comprising determining the probability density of the mean μ feature value and the variance σ² feature value using a sample vector x̂ using:

$$p(\hat{x}_j|\mu_j, \sigma_j^2) = \frac{1}{\sqrt{2\pi\sigma_j^2}} e^{\frac{(\hat{x}_j - \mu_j)^2}{2\sigma_j^2}}$$

and multiplying each of the determined probability densities using:

$$p(\hat{x}) = \prod_{j=1}^{n} p(\hat{x}_j|\mu_j, \sigma_j^2)$$

where n=a number of features.

3. The method of claim 1, wherein the at least one feature is indicative of one of a source information feature, a modeling feature, a wireframe feature, a sketch element feature, a roof element feature, a wall structure feature, a wall element feature and an exterior element feature.

4. The method of claim 1, further comprising calculating a mean μ and a covariance matrix Σ from a training sample using:

$$\mu_j = \frac{1}{m}\sum_{i=1}^{m} x_j^{[i]} \quad \Sigma = \frac{1}{m}\sum_{i=1}^{m}(x^i - \mu)(x^i - \mu)^T$$

5. The method of claim 1, further comprising determining a probability density of a mean μ feature value and a covariance matrix Σ feature value using a sample vector x̂ using:

$$p(\hat{x}) = \frac{1}{\sqrt{(2\pi)^m |\Sigma|}} e^{-\frac{1}{2}(\hat{x} - \mu)\Sigma^{-1}(\hat{x} - \mu)^T}$$

6. The method of claim 5, further comprising determining the computerized building model is anomalous when a determined probability density p(x̂) is less than the probability threshold.

7. A system for identifying an anomaly in a building model, the system comprising:

a memory; and a processor in communication with the memory, the processor:

receiving at a computer system the building model;

selecting at least one feature of the building for analysis;

processing the at least one feature to assign a Gaussian distribution having at least one parameter to the selected at least one building feature;

processing the at least one parameter to determine a probability density of a feature value using a sample vector of the building model;

processing the building model to improve accuracy of the building model using the probability density;

calculating a mean μ and a variance σ² from a training sample using:

$$\mu_j = \frac{1}{m}\sum_{i=1}^{m} x_j^{[i]} \quad \sigma_j^2 = \frac{1}{m}\sum_{i=1}^{m}(x_j^{[i]} - \mu_j)^2$$

where m=a number of samples; and determining the building model is anomalous when a multiplied probability density p(x̂) of each of the probability density of a mean μ feature value the probability density of a variance σ² feature value is less than a probability threshold.

8. The system of claim 7, wherein the processor determines the probability density of the mean μ feature value and the variance σ² feature value using a sample vector x̂ using:

$$p(\hat{x}_j|\mu_j, \sigma_j^2) = \frac{1}{\sqrt{2\pi\sigma_j^2}} e^{\frac{(\hat{x}_j - \mu_j)^2}{2\sigma_j^2}}$$

and multiplying each of the determined probability densities using:

$$p(\hat{x}) = \prod_{j=1}^{n} p(\hat{x}_j|\mu_j, \sigma_j^2)$$

where n=a number of features.

9. The system of claim 7, wherein the at least one feature is indicative of one of a source information feature, a modeling feature, a wireframe feature, a sketch element feature, a roof element feature, a wall structure feature, a wall element feature and an exterior element feature.

10. The system of claim 7, wherein the processor calculates a mean μ and a covariance matrix Σ from a training sample using:

$$\mu_j = \frac{1}{m}\sum_{i=1}^{m} x_j^{[i]} \quad \Sigma = \frac{1}{m}\sum_{i=1}^{m}(x^i - \mu)(x^i - \mu)^T$$

11. The system of claim 7, wherein the processor determines a probability density of a mean μ feature value and a covariance matrix Σ feature value using a sample vector x̂ using:

$$p(\hat{x}) = \frac{1}{\sqrt{(2\pi)^m |\Sigma|}} e^{-\frac{1}{2}(\hat{x} - \mu)\Sigma^{-1}(\hat{x} - \mu)^T}$$

12. The system of claim 11, wherein the processor determines the building model is anomalous when a determined probability density p(x̂) is less than the probability threshold.

* * * * *

UNITED STATES PATENT AND TRADEMARK OFFICE
CERTIFICATE OF CORRECTION

| | |
|---|---|
| PATENT NO. | : 11,775,700 B2 |
| APPLICATION NO. | : 16/593708 |
| DATED | : October 3, 2023 |
| INVENTOR(S) | : Jose Luis Esteban and Eladio Rego |

It is certified that error appears in the above-identified patent and that said Letters Patent is hereby corrected as shown below:

In the Claims

In Column 7, Line 9, Claim 1, the second instance of the words "the probability density of" should be deleted.

In Column 8, Line 17, Claim 7, the word --and-- should be inserted after the word "value".

Signed and Sealed this
Twenty-sixth Day of March, 2024

Katherine Kelly Vidal
*Director of the United States Patent and Trademark Office*